United States Patent [19]

Harper et al.

[11] 4,451,694
[45] May 29, 1984

[54] MINIATURIZED HIGH CAPACITANCE BUS BAR ASSEMBLY

[75] Inventors: William P. Harper, Phoenix; Donald H. DeVries, Mesa, both of Ariz.

[73] Assignee: Rogers Corporation, Rogers, Conn.

[21] Appl. No.: 440,752

[22] Filed: Nov. 12, 1982

Related U.S. Application Data

[62] Division of Ser. No. 249,640, Mar. 31, 1981, Pat. No. 4,401,843.

[51] Int. Cl.³ .............................................. H01B 7/00
[52] U.S. Cl. ................................................. 174/72 B
[58] Field of Search ..................................... 174/72 B

[56] References Cited

U.S. PATENT DOCUMENTS

| | | | |
|---|---|---|---|
| 4,113,981 | 9/1978 | Fujita et al. | 174/88 R |
| 4,236,038 | 11/1980 | Taylor | 174/72 B |
| 4,236,046 | 11/1980 | DeVries | 174/72 B |
| 4,266,091 | 5/1981 | Fukuda | 174/72 B |

Primary Examiner—Laramie E. Askin
Attorney, Agent, or Firm—David S. Fishman

[57] ABSTRACT

Various structures for and methods of constructing miniaturized high capacitance bus bars are presented. The bus bars incorporate discrete high capacitive elements between a pair of bus bar conductors. In a preferred embodiment, a zebra film comprised of an elastomeric material having alternating strips of conducting and nonconducting material is positioned between the capacitive elements and the bus bar conductors. This zebra structure establishes electrical contact between the capacitive elements while avoiding the development of short circuits between the two bus bar conductors. This zebra structure may also have a mechanical force means applied whereby the applicable conductive surfaces are urged into electrical contact with the elastomeric strip material.

2 Claims, 8 Drawing Figures

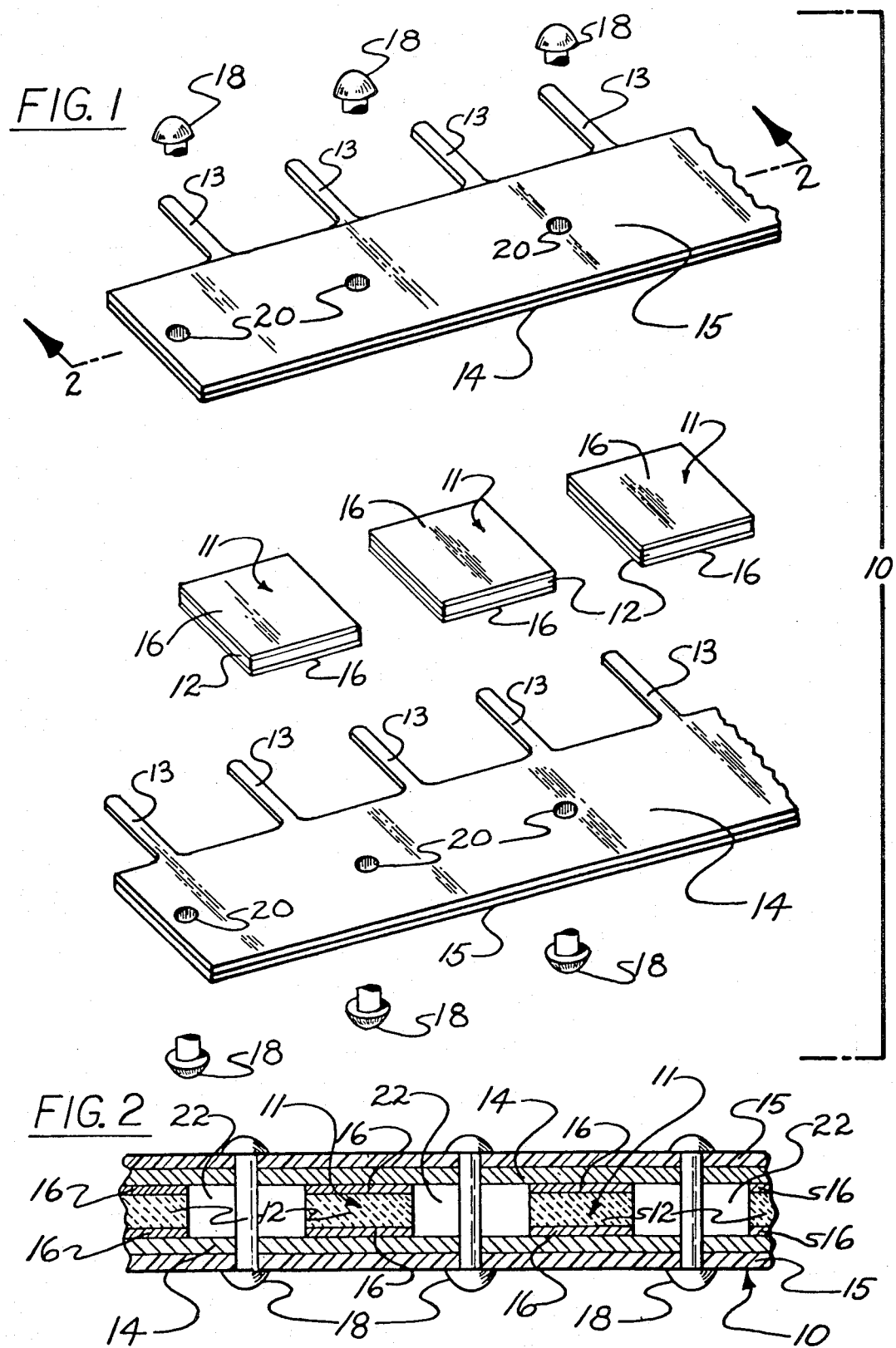

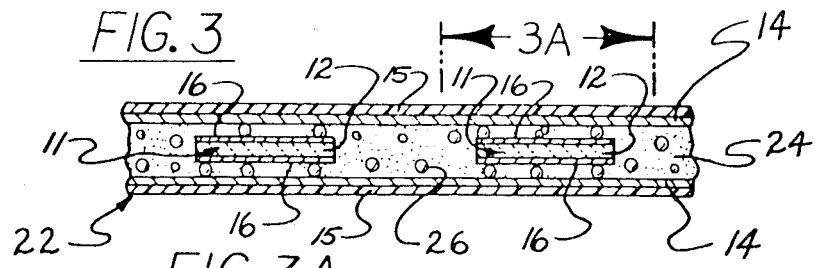
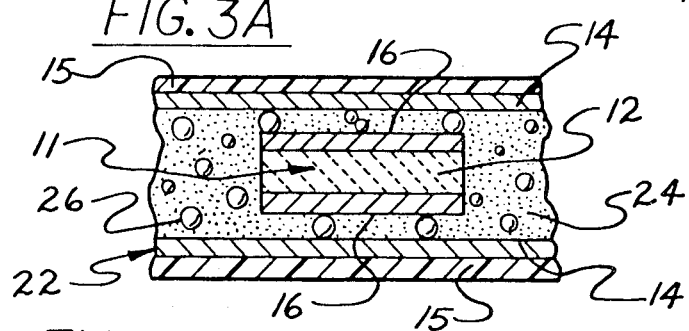
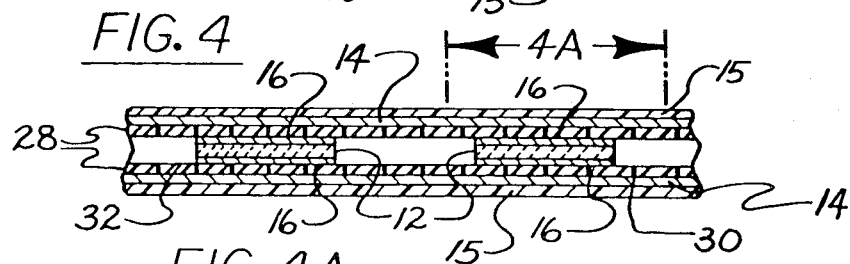
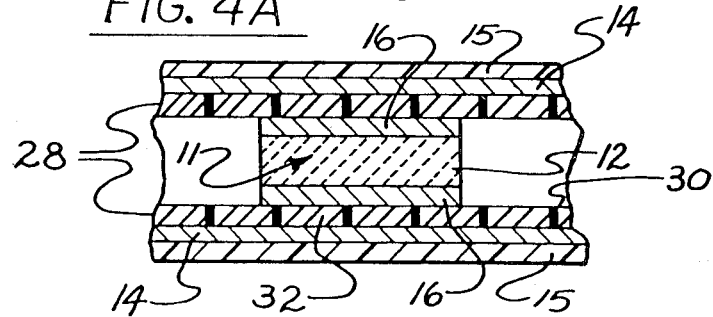
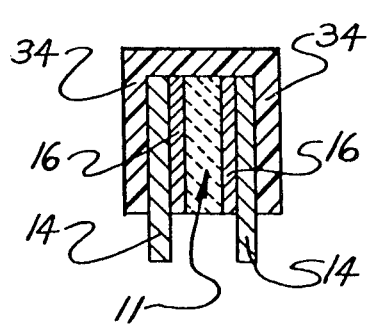
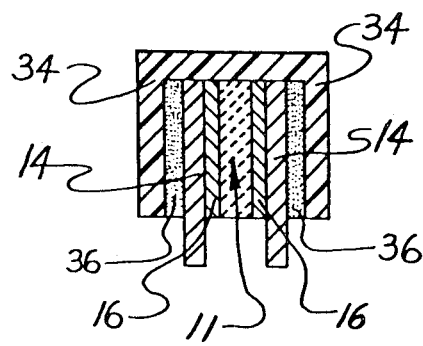

MINIATURIZED HIGH CAPACITANCE BUS BAR ASSEMBLY

This application is a division of application Ser. No. 249,640 filed Mar. 31, 1981, now U.S. Pat. No. 4,401,843.

BACKGROUND OF THE INVENTION

1. Field of the Invention

This invention relates to bus bars, especially relatively small or miniature bus bars. More particularly, this invention relates to multilayer bus bar assemblies, and the method of manufacture thereof, wherein the bus bar assembly incorporates capacitive elements between layers of bus conductors to provide high capacitance bus bars.

2. Description of the Prior Art

Conventional bus bars of relatively small or miniature size have been known in the art for a number of years. Such bus bar devices are used for power and/or signal distribution in many systems, such as, for example, computer back panels and integrated circuit systems. Such prior art multilayer bus bars comprise at least two conductive plates (usually in the form of elongated strips or bars of copper) separated by an insulating film. A typical prior art bus bar of this type may use copper conductors having a thickness of about 10 mils, and the overall dimensions of the bus bar may be from about 0.019 to 0.120 inch thick, from about 0.150 to 0.200 inch wide and range in length up to about 16 inches. Typically, the separating insulating layer is a plastic dielectric film such as the polyester material known as MYLAR. The MYLAR separator layer and the conductive plates are bonded together by an adhesive. Conventional prior art bus bars of this type have relatively low capacitance which results in the device being comparatively ineffective in attenuating high frequency noise. This high frequency noise is highly undesirable, especially when the bus bar is used for signal distribution.

One prior art approach to eliminating this noise problem involves connecting capacitors to the bus bar after the completion of the bus bar assembly. While this approach raised the capacitance and minimized the noise, it resulted in additional expense and time in manufacturing.

Another type of bus bar structure disclosed in the prior art involves disposing discrete high capacitive elements between a pair of bus conductors. These bus bars have the desired high capacitance. Examples of such high capacitance bus bars are disclosed in U.S. Pat. Nos. 4,236,038 and 4,236,046 and in patent application Ser. No. 950,266 filed Oct. 10, 1978, now U.S. Pat. No. 4,266,091, all of which are owned by the assignee of the present invention. The high capacitive elements utilized in those inventions are thin layers or chips of dielectric material, usually a ceramic with a high dielectric constant. The opposing surfaces of the chips are typically coated with a thin, integral and continuous film of conductive material and these conductive films are electrically connected to respective of the bus conductors.

SUMMARY OF THE PRESENT INVENTION

The present invention provides novel and improved apparatus for and methods of construction of miniaturized bus bar assemblies which have capacitive elements disposed between a pair of bus bar conductors.

In accordance with each of the several embodiments of the present invention, the capacitive elements are positioned between and maintained in electrical contact with a pair of bus bar conductors. The electrical contact is established and maintained by specific structural features in the several embodiments.

One embodiment of the present invention involves positioning the capacitive element between a pair of bus bar conductors and mechanically maintaining the assembly of bus bar conductors and capacitive elements with non-conducting rivets positioned between capacitive elements.

Another embodiment of the present invention involves bonding the capacitive elements between a pair of bus bar conductors with a conductive adhesive which contains a low density of relatively large conductive particles. The distribution and size of the conductive particle allows electrical contact between the capacitive elements and the bus bar conductors, but not between the bus bar conductors.

Still another embodiment of the present invention has a "zebra" film between the capacitive elements and the bus bar conductors. This "zebra" film is an elastomeric material which has alternating strips of conducting and non-conducting material. This structure establishes electrical contact between the capacitive elements and the bus bar conductors, without risk of shorting between the bus bar conductors.

Still another embodiment involves retaining the capacitive elements in place between the bus bar conductors within a shell, by mechanical force. This mechanical force may be effected in one of two ways. In one arrangement, the shell is comprised of a non-conductive material, which constricts upon curing. When cured, this shell clamps the bus bar conductors into engagement with the capacitive elements. The second arrangement involves adhering the bus bar conductors and capacitive elements within a preformed shell with a non-conductive adhesive. This adhesive expands volumetrically when cured, thus clamping the bus bar conductors to the capacitive elements.

Accordingly, the present invention has as its principal object the construction of miniaturized bus bars which incorporate high capacitive elements between the bus bar conductors and wherein electrical contact is positively established only between the conductor and the high capacitive elements without risk of shorting between the bus bars.

DESCRIPTION OF THE DRAWINGS

The present invention may be better understood and its numerous objects and advantages will be apparent to those skilled in the art by reference to the accompanying drawing wherein like reference numerals refer to like elements in the several FIGURES and in which:

FIG. 1 is a perspective exploded view of one embodiment of the present invention.

FIG. 2 is a sectional elevation view of the structure of FIG. 1 taken along line 2—2 of FIG. 1.

FIG. 3 is a sectional view similar to FIG. 2 of a second embodiment of the invention.

FIG. 3A is an enlarged view of a detail of the segment 3A—3A of FIG. 3.

FIG. 4 is a sectional view similar to FIG. 2 of a third embodiment of the invention.

FIG. 4A is an enlarged view of a detail of the segment 4A—4A of FIG. 4.

FIGS. 5 and 6 are sectional end views of still other embodiments of the present invention.

DESCRIPTION OF PREFERRED EMBODIMENTS OF THE PRESENT INVENTION

Referring to FIGS. 1 and 2, one embodiment of a bus bar of the present invention is seen generally at 10. Bus bar 10 has capacitive elements 11 positioned between a pair of bus bar conductors 14 which have distribution prongs or fingers 13. Capacitive elements 11 are preferably each comprised of a ceramic chip 12 having a high dielectric constant, with opposing sides being coated with a conductive layer 16. The chips 12 are preferably barium titanate and conductive layers 16 are preferably a thin intimate coating of silver or other metal. Elements 11 are secured between conductors 14 by riveting the assembly together with non-conducting rivets 18. Non-conductive rivets 18 are preferably molded of plastic or similar material. Rivets 18 are inserted through cut-outs 20, which are provided through both conductors 14. Capacitive elements 11 are positioned between cut-outs 20, so that the rivets 18 divide the interior of the bus bar assembly into chip compartments 22, with the rivets also acting as barriers or separators between adjacent capacitive elements 11.

The outer surface of each of bus bar conductors 14 has an insulating coating 15. Coating 15 may be laminated to the outer surface of each conductor 14, or it may be a coating which encapsulates the entire bus bar assembly.

The method of assembly of the structure of FIGS. 1 and 2 would be as follows:

1. mount one bus bar conductor (either conductor 14 or a laminate of conductor 14 and coating 15) on rivets 18 (only one head of which has been formed) through holes 20
2. position elements 11 on one conductor 14 between rivets 18 with one conductive surface 16 in direct contact with the conductor 14
3. position the other bus bar conductor (either conductor 14 or a laminate of conductor 14 and coating 15) on rivets 18 through holes 20 with this other conductor 14 in contact with the other conductive surface 16 of each element 11
4. form the other head of each rivet 18 (such as by conventional heat forming of plastic rivets or stakes) so as to complete the assembly and urge the conductors 14 into firm, intimate, mechanical and electrical contact with the adjacent conductive surfaces 16 on each capacitive element 11.

With reference to FIGS. 3 and 3A, another embodiment of the present invention is generally seen at 22. This embodiment utilizes an adhesive 24 in place of the rivets 18 of the above-discussed embodiment. Preferably this adhesive is an anisotropically electrically conductive material which bonds capacitive elements 11 to bus bar conductors 14. Conductive adhesive 24 has a low density of relatively large conductive particles 26. Conductive particles 26 have a size ranging from 0.0005 inch to 0.005 inch. Preferably, particles 26 are silver coated glass spheres. The adhesive material may be comprised of a thermoplastic resin material with a melt temperature of between 350° F. and 400° F. The adhesive should flow readily in the melt condition and bond agressively to high and low energy polymer surfaces, metal surfaces and glass. Also, the viscosity of the resin should be such that the conductive particles 26 therein will remain suspended in the uncured state. A suitable thermoplastic material for this purpose is GELVA MULTIPOLYMER number 263, available from Monsanto Company. The distribution and size of particles 26 allows for electrical contact only between conductive layers 16 of capacitive elements 11 and bus bar conductors 14. This electrical contact is established by only one or two of the relatively large size particles 26 between adjacent surfaces 14 and 16. However, the population density of particles 26 in adhesive 24 is low enough so that there is no conductive chain of particles between the conductors 14 or between adjacent capacitive elements 11.

The method of assembly of the structure of FIGS. 3 and 3A would be as follows:

1. apply a coating of anisotropically conductive adhesive 24 to one surface of a first conductor 14.
2. position a plurality of capacitive elements 11 on that adhesively coated surface of conductor 14 in spaced apart locations with one surface 16 adjacent to the first conductor 14
3. apply a coating of anisotropically conductive adhesive 24 to a surface of a second conductor 14
4. position the second conductor 14 on the elements 11 with the adhesively coated surface thereof in contact with the other surface 16 of the elements 11
5. apply sufficient pressure to the assembly to squeeze out excess adhesive from between adjacent surfaces, conductors 14 and conductive surfaces 16 to establish electrical contact only between conductors 14 and surfaces 16
6. cure the adhesive if necessary, and/or encapsulate the assembly in a insulating plastic coating (15) if desired.

FIGS. 4 and 4A illustrate another embodiment of the present invention which is similar to the above-discussed embodiment in FIG. 3. Here electrical contact is established between the capacitive element 12 and bus bar conductor 14, by "zebra" tapes 28. Tape 28 is a conventional and commercially available elastomeric material having alternating strips of conductive bands 30 such as carbon particles in an elastomeric insulating material 32. A commercially available "zebra" tape 28 is available from Technit Corporation. Tape 28 is positioned between capacitive elements 11 and bus bar conductors 14. The bus bar assembly is held together in any suitable manner, such as by conductive or non-conductive adhesive appropriately located between layers of the assembly.

The method of assembly of the structure of FIGS. 4 and 4A would be as follows:

1. Bond a layer of "zebra" tape 28 to each of two bus bar conductors 14. The "zebra" tape 28 may be bonded to conductors 14 in any convenient manner as long as conductive contact is established between the conductive strips 30 and the conductors 14 at locations which correspond to locations of capacitive elements 11 in the final assembly. This may, for example, be accomplished by conductive adhesive between abutting surfaces of each conductor 14 and "zebra" tape 28.
2. Apply conductive adhesive to both surfaces of a plurality of capacitive elements 11, or, alternatively, apply conductive adhesive to spaced apart locations on the exposed surface of each layer of "zebra" tape 28 at locations corresponding to the capacitive elements 11 in the final assembly.
3. Position elements 11 at the appropriately spaced locations on one of the "zebra" tapes 28 on one conductor 14 with one of the conductive surfaces 16 in conductive contact with "zebra" tape bands 30.

4. Position the other conductor 14 and its "zebra" tape 28 on the other surface 16 of the elements 11, with the other conductive surfaces 16 in conductive contact with the bands 30.

5. Cure or otherwise complete the adhesive system assembly, if necessary.

In the FIGS. 4 and 4A arrangement, non-conductive adhesive can also be used, as long as the adhesive is applied in an appropriate pattern or spacing to insure that there are conductive contact paths between the capacitor surfaces 16 and the bus conductors 14 through the zebra tape 28.

FIGS. 5 and 6 illustrate embodiments of the present invention which utilize a form of mechanical force to retain the capacitive elements 11 between a pair of bus bar conductors 14. Referring to FIG. 5, this mechanical force may be applied by placing the pre-arranged capacitive elements 11 and bus bar conductors 14 within a plastic U-shaped channel or trough 34. This channel 34 is comprised of a material which constricts upon curing. Thus, in its cured state, channel 34 will clamp bus bar conductors 14 to capacitive elements 12. Examples of materials having an "elastic memory" which will constrict upon exposure to an elevated temperature, and are suitable for use in this embodiment of the present invention include irradiated polymers such as polyolefin and polyvinyl chloride.

The method of assembly of the structure of FIG. 5 would be as follows:
1. position one conductor 14 in channel 34
2. position capacitor elements 11 in channel 34 adjacent the conductor 14 at appropriately spaced stations
3. position the second conductor 14 in the channel 34 to sandwich the elements 11 between conductors 14.
4. cure the assembly by application of heat to cause channel 34 to constrict or contract to form a mechanically integral assembly with electrical contact established between the surfaces 16 of the capacitors and the conductors 14.

Alternatively, a subassembly may first be formed of an unsecurred assembly of capacitors 11 sandwiched between conductors 14. This subassembly may then be positioned in channel 34 and the curing of channel 34 effected to cause it to constrict to form the final mechanically and electrically integral assembly.

Referring to FIG. 6, the capacitive elements 11 and bus bar conductors 14 may also be positioned within a channel 34, which is already in its cured state; i.e., has its final dimensions. The mechanical force is applied by bonding the bus bar conductors 14 within channel 34 with an adhesive 36, which expands volumetrically upon curing. One example of an adhesive 36 which is suitable for use in the embodiment of the present invention depicted in FIG. 6 is a foamed adhesive. Upon expansion of the adhesive 36 by heat, the expanded adhesive pushes against the walls of channel 34 and the bus bar components to form a mechanically integral pressurized assembly to hold the conductors 14 against the capacitor surfaces 16. This pressure also establishes electrical contact between conductors 14 and surfaces 16.

The method of assembly of the structure of FIG. 6 is as follows:
1. coat one side of each conductor 14 with foamable adhesive 36
2. position each conductor 14 in channel 34 with the adhesively coated side against the inner surface of the channel
3. position the capacitors between the conductors 14
4. cure the assembly by heat to expand the adhesive.

Alternatively, the adhesive could be applied to the inner surfaces of the channel 34, and/or the capacitors 11 and conductors 14 may be formed into a subassembly before being placed in channel 34.

The bus bar conductors of the present invention are copper elements, which may be tin plated; and they are approximately 10 mils thick and range in width or height from about 0.150 to about 0.200 inch and range in length from about 2 to 16 inches, depending on the particular application for the bus bar. The ceramic material from which the capacitive chips or strip capacitors are formed preferably has a relatively high dielectric constant, for example a dielectric constant in excess of 8,000; and the thickness of the dielectric material may range from about 0.005 inch to about 0.015 inch and have opposed face surface dimensions in the range of from about 0.2 inch by 0.2 inch to about 0.2 inch by 3.0 inches for individual chips or may extend for the length of the bus bar assembly if in the form of ribbon capacitors.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A high capacitance bus bar assembly comprising:
at least two spatially separated bus bar conductors having inwardly facing planar surfaces;
a plurality of capacitors, said capacitors being arranged linearly and positioned between said bus bar conductors, said capacitors each comprising a dielectric material disposed between a pair of oppositely disposed planar conductive outer surfaces, said conductive outer surfaces of said capacitors being in electrical contact with respective of said bus bar conductor inwardly facing surfaces;
elastomeric strip means, said strip means being positioned between said capacitors conductive surfaces and said bus bar conductor inwardly facing surfaces, said strip means comprising alternating bands of conductive and non-conductive materials, said bands of conductive material establishing electrical contact between said capacitors conductive surfaces and said bus bar conductor inwardly facing surfaces; and
means for applying a mechanical force which urges said capacitor conductive surfaces and said bus bar conductor inwardly facing surfaces against and into electrical contact with said elastomeric strip means.

2. A high capacitance bus bar assembly comprising:
at least two spatially separated bus bar conductors having inwardly facing planar surfaces;
a plurality of capacitors, said capacitors being arranged linearly and positioned between said bus bar conductors, said capacitors each comprising a dielectric material disposed between a pair of oppositely disposed planar conductive outer surfaces, said conductive outer surfaces of said capacitors being in electrical contact with respective of said bus bar conductor inwardly facing surfaces;

elastomeric strip means, said strip means being positioned between said capacitors conductive surfaces and said bus bar conductor inwardly facing surfaces, said strip means comprising alternating bands of conductive and non-conductive materials, said conductive material establishing electrical contact between said capacitors conductive surfaces and said bus bar conductor inwardly facing surfaces; and means for securing said bus bar conductors, said capacitors and said elastomeric strip means in an assembly.

* * * * *